(12) United States Patent
Nardi et al.

(10) Patent No.: US 9,680,092 B2
(45) Date of Patent: Jun. 13, 2017

(54) CURRENT SELECTORS FORMED USING SINGLE STACK STRUCTURES

(71) Applicant: Intermolecular, Inc., San Jose, CA (US)

(72) Inventors: Federico Nardi, Palo Alto, CA (US); Mark Clark, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 15/225,980

(22) Filed: Aug. 2, 2016

(65) Prior Publication Data
US 2017/0062524 A1    Mar. 2, 2017

Related U.S. Application Data

(60) Provisional application No. 62/210,798, filed on Aug. 27, 2015.

(51) Int. Cl.
| | |
|---|---|
| *H01L 45/00* | (2006.01) |
| *H01L 27/24* | (2006.01) |
| *H01L 29/861* | (2006.01) |
| *H01L 27/108* | (2006.01) |
| *H01L 27/11* | (2006.01) |
| *H01L 29/45* | (2006.01) |
| *H01L 23/528* | (2006.01) |

(52) U.S. Cl.
CPC .......... *H01L 45/122* (2013.01); *H01L 23/528* (2013.01); *H01L 27/10805* (2013.01); *H01L 27/11* (2013.01); *H01L 27/2418* (2013.01); *H01L 29/45* (2013.01); *H01L 29/861* (2013.01); *H01L 45/00* (2013.01); *H01L 45/124* (2013.01); *H01L 45/1233* (2013.01)

(58) Field of Classification Search
CPC ......... H01L 45/00; H01L 45/04; H01L 45/06; H01L 45/065; H01L 45/08; H01L 45/085; H01L 45/10; H01L 45/122; H01L 45/1233; H01L 45/124; H01L 45/145
See application file for complete search history.

(56) References Cited

U.S. PATENT DOCUMENTS

| | | | | |
|---|---|---|---|---|
| 2005/0254291 A1* | 11/2005 | Happ | .................. | G11C 13/0011 365/163 |
| 2010/0109085 A1* | 5/2010 | Kim | ...................... | H01L 45/085 257/364 |

(Continued)

*Primary Examiner* — Eduardo A Rodela

(57) ABSTRACT

Provided are hybrid electrodes comprising base structures and plugs disposed within the base structures. Also provided are selector elements comprising such hybrid electrodes and memory arrays with selector elements used for addressing individual memory cells. Specifically, the base structure and plug of a hybrid electrode have different compositions but both interface the same dielectric of the selector element. This design allows anti-parallel diode and other configurations with a very few components. The base structure and plug may have different dopants, different stoichiometry of the same alloy, or formed from completely different materials. The interfacing surface portions of a hybrid electrode may have different sizes. A combination of these surface portions (e.g., areas, surface conditions) and materials (e.g., compositions) can be used for tuning operating characteristics of selector elements using such hybrid electrodes.

14 Claims, 8 Drawing Sheets

(56) References Cited

U.S. PATENT DOCUMENTS

| | | | |
|---|---|---|---|
| 2010/0284213 A1* | 11/2010 | Savransky | G11C 11/5678 365/163 |
| 2011/0186798 A1* | 8/2011 | Kwon | H01L 45/06 257/2 |
| 2014/0246641 A1* | 9/2014 | Jameson, III | H01L 45/1253 257/4 |
| 2014/0299833 A1* | 10/2014 | Cheong | H01L 45/141 257/4 |

* cited by examiner

CURRENT SELECTORS FORMED USING SINGLE STACK STRUCTURES

CROSS-REFERENCE TO RELATED APPLICATIONS

This application claims the benefit under 35 U.S.C. §119 (e) of U.S. Provisional Patent Application 62/210,798, entitled: "Current Selectors Formed Using Single Stack Structures" filed on Aug. 27, 2015, which is incorporated herein by reference in its entirety for all purposes.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including magneto-resistive random access memory (MRAM), ferroelectric random access memory (FRAM), phase change memory (PCM), spin transfer torque random access memory (STT-RAM), and resistive random access memory (ReRAM), among others.

Resistive memory devices are formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense. Furthermore, the parasitic resistance (or the parasitic impedance, in the actual case of time-dependent operation), (e.g. due to sneak current paths that exist in the system), may depend on the state of the system, such as the data stored in other memory cells. It is often preferable that the possible variations of the parasitic impedance be unsubstantial compared to the difference in the values of the high and low resistance of a memory cell.

Similar issues can arise from integration of the resistive switching memory element with current selector elements (also known as current limiter or current steering elements), such as diodes and/or transistors. Control elements (e.g. selector devices) in nonvolatile memory structures can screen the memory elements from sneak current paths to ensure that only the selected bits are read or programmed. Schottky diode can be used as a selector device, which can include p-n junction diode or metal-semiconductor diode, however, this requires high thermal budget that may not be acceptable for 3-dimensional (3D) memory application. Metal-Insulator-Metal Capacitor (MIMCAP) tunneling diodes may have a challenge of providing controllable low barrier height and low series resistance. In some embodiments, the control element can also function as a current limiter or control element. In some embodiments, a control element can suppress large currents without affecting acceptable operation currents in a memory device. For example, a control element can be used with the purpose of increasing the ratio of the measured resistances in the high and low resistance state, further making the non-volatile memory device less susceptible to the noise due to parasitic impedances in the system. Note that the terms "control element", "current selector", "current limiter", and "steering element" may often times be substituted for each other, due to a substantial overlap in the functional utility of the elements they may describe. Such a substitution does not affect the scope of this description, which is limited only by the claims.

Therefore, there is a need for a control element that can meet the design criteria for advanced memory devices.

SUMMARY

Provided are hybrid electrodes comprising base structures and plugs disposed within the base structures. Also provided are selector elements comprising such hybrid electrodes and memory arrays with selector elements used for addressing individual memory cells. Each selector element includes a hybrid electrode and is connected in series with a memory cell. The base structure and the plug of a hybrid electrode have different compositions. Furthermore, both the base structure and the plug interface the same dielectric of the selector element. This design allows anti-parallel diode and other configurations with a very few components thereby allowing reducing the size of the overall circuit. The base structure and plug may have different dopants, different stoichiometry of the same alloy, or formed from different materials. The interfacing surface portions of a hybrid electrode may have different sizes. A combination of these surface portions (e.g., areas, surface conditions) and materials (e.g., compositions) can be used for tuning operating characteristics of selector elements using such hybrid electrodes.

In some embodiments, a selector element or, more generally, a semiconductor device comprises a first electrode, a dielectric layer, and a second electrode. The first electrode is a hybrid electrode and comprises a base structure and a plug disposed within the base structure. The base structure comprises a first material and forms a first surface portion. The plug comprises a second material and forms a second surface portion. The first material and the second material have different compositions. The dielectric layer directly interfaces the first surface portion and the second surface portion of the first electrode. In other words, the dielectric layer directly interfaces both the base structure and the plug. The second electrode forms a stack with the first electrode and the dielectric layer such that the dielectric layer is disposed between the first electrode and the second electrode. In some embodiments, the second electrode may be also a hybrid electrode. In some embodiments, the dielectric layer comprises copper, germanium, and selenide. More specifically, the dielectric layer comprises $Cu_2GeSe_3$.

In some embodiments, at least one of the first material and the second material comprises a dopant. For example, the first material may have a p-type dopant, while the second material may have an n-type dopant. In some embodiments, at least one of the first material and the second material comprises a material selected from the group consisting of titanium metal, aluminum metal, tungsten metal, nickel metal, titanium nitride, titanium silicon nitride, tantalum silicon nitride, molybdenum dioxide, and polysilicon. More specifically, both the first material and the second material comprise a material selected from the group consisting of titanium metal, aluminum metal, tungsten metal, nickel metal, titanium nitride, titanium silicon nitride, tantalum silicon nitride, molybdenum dioxide, and polysilicon. However, these materials are different for the plug and the base structure.

In some embodiments, the first portion and the second portion of the shared surface are disposed within a same plane. In other words, the first portion and the second portion may be both planar and, more specifically, co-planar. The area of the first portion may be different from the area of the second portion. In some embodiments, the base portion encloses the plug at least around the perimeter of the second surface portion. More specifically, the base portion encloses all surfaces of the plug besides the second surface portion. In some embodiments, the base portion and the plug are concentric. The plug may be cylindrical.

In some embodiments, the selector element is operable to exhibit volatile and non-volatile hysteresis. Furthermore, the selector element is operable as an anti-parallel dual diode.

Also provided is a hybrid electrode for a selector element or, more generally, for a semiconductor device. The hybrid electrode comprises a base structure and a plug disposed within the base structure. The base structure comprises a first material and forms a first surface portion. The plug comprises a second material and forms a second surface portion. The first material and the second material have different compositions. Furthermore, at least one of the first material and the second material comprises a material selected from the group consisting of titanium metal, aluminum metal, tungsten metal, nickel metal, titanium nitride, titanium silicon nitride, tantalum silicon nitride, molybdenum dioxide, and polysilicon. Various other features of the hybrid electrode are presented above.

Also provided is a memory array comprising a memory cell and a selector element connected in series with the memory cell. The selector element comprises a first electrode, a dielectric layer, and a second electrode. The first electrode is a hybrid electrode and comprises a base structure and a plug disposed within the base structure. The base structure comprises a first material and forms a first surface portion. The plug comprises a second material and forms a second surface portion. The first material and the second material have different compositions. The dielectric layer directly interfaces the first surface portion and the second surface portion of the first electrode. The second electrode forms a stack with the first electrode and the dielectric layer such that the dielectric layer is disposed between the first electrode and the second electrode. The memory cell may be one of dynamic random-access memory (DRAM), static random-access memory (SRAM), or resistive random-access memory (RRAM). The memory array may also comprise a word line directly interfacing each of the base structure and the plug of the first electrode.

These and other embodiments are described further below with reference to the figures.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Current selectors and other like semiconductor devices are often complex structures having many different components and occupying large spaces in electronic circuits. At the same time, the semiconductor industry strives for circuit miniaturization. For example, a selector may be formed as two diodes connected in parallel in a flipped manner. This arrangement of two diodes is sometimes referred to as an anti-parallel configuration. In this example, each diode may be a separate physical structure having a set of individual components.

It has been found that current selectors and other like semiconductor devices may be formed using a single stack of three layers, such as two electrodes (at least one of which is a hybrid electrode) and one dielectric layer disposed between the two electrodes. In some embodiments, both electrodes directly interface the dielectric layer. Alternatively, various functional layers (e.g., barrier layers) may be disposed between one or both electrodes and the dielectric layer. The current selection aspects of such stacks may be achieved by using particular configurations of electrodes, dielectric layers, or both. Specifically, a hybrid electrode comprising a base structure and a plug disposed within the base structure may be used. The base structure comprises a first material and forms a first surface portion, while the plug comprises a second material (different from the first material) and forms a second surface portion. The dielectric layer directly interfaces the first surface portion and the second surface portion of the first electrode. Therefore, at least two paths are available through between the dielectric layer and the hybrid electrode, one through the interface with the plug and the other one through the interface with the base structure.

Figure 1A:
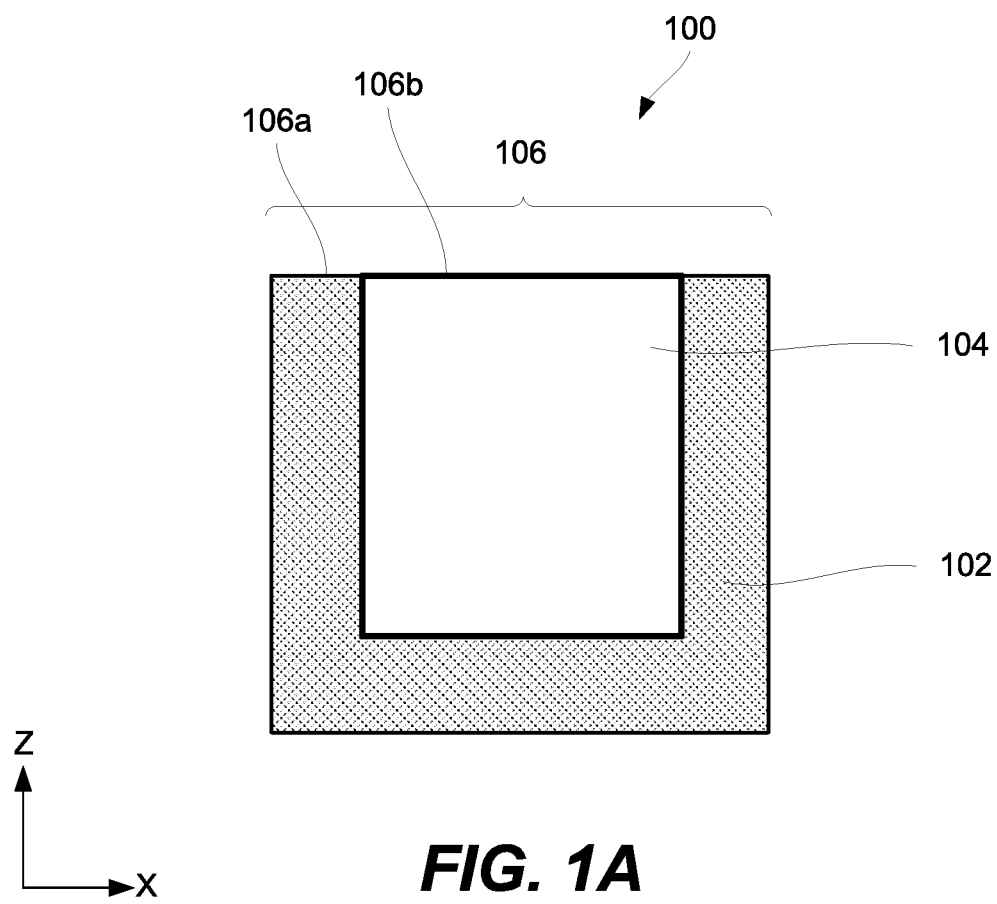
FIG. 1A is a schematic cross-sectional side view of a hybrid electrode including a plug and a base structure, in accordance with some embodiments.

FIG. 1A is a schematic illustration of hybrid electrode 100 comprising base structure 102 and plug 104, in accordance with some embodiments. Plug 104 may be disposed within base structure 102 or, more specifically, surrounded by base structure 102 as shown in schematic top views of FIGS. 1B and 1C. Alternatively, plug 104 may extend parallel to base structure 102 as, for example, shown in a schematic top view of FIG. 1D. Base structure 102 and plug 104 may directly interface each other. Alternatively, a barrier layer or even an insulating layer may be disposed between base structure 102 and plug 104.

Base structure 102 and plug 104 may have different compositions. For example, base structure 102 and plug 104 may have different types of dopants. More specifically, one of base structure 102 and plug 104 may include an n-type dopant, while the other may include a p-type dopant. Alternatively, base structure 102 and plug 104 may include the same type of dopant (or even the same dopant) but having different concentrations. Furthermore, only one of base structure 102 and plug 104 may be doped. Otherwise, the material of base structure 102 and plug 104 may be the same.

In some embodiments, base structure 102 and/or plug 104 comprises a material selected from the group consisting of titanium metal, aluminum metal, tungsten metal, nickel metal, titanium nitride, titanium silicon nitride, tantalum silicon nitride, molybdenum dioxide, and polysilicon. More specifically, both base structure 102 and plug 104 may comprise a material selected from the group consisting of titanium metal, aluminum metal, tungsten metal, nickel metal, titanium nitride, titanium silicon nitride, tantalum silicon nitride, molybdenum dioxide, and polysilicon. However, the material of base structure 102 may be different from the material of plug 104.

In general, material selection for each of base structure 102 and plug 104 depends on desirable functionality of a semiconductor device that includes hybrid electrode 100. In some embodiments, this semiconductor device is a selector element.

Base structure 102 and plug 104 form shared surface 106 of hybrid electrode 100 as, for example, is shown in FIG. 1A. Specifically, base structure 102 forms first surface portion 106a, while plug 104 forms second surface portion 106b. Shared surface 106 may be a planar surface. In other words, first surface portion 106a may be coplanar to second surface portion 106b. Alternatively, second surface portion 106b may protrude beyond the plane of first surface portion 106a. In this example, second surface portion 106b is not planar even though it may include a planar sub-portion.

The area of first surface portion 106a (formed by base structure 102) may be the same or different from the area of second surface portion 106b (formed by plug 104). For example, the area ratio of first surface portion 106a to second surface portion 106b may be between about 0.1 and 0.9 or, more specifically, between about 0.2 and 0.8 or even between about 0.3 and 0.7. In another example, the area ratio of second surface portion 106b to first surface portion 106a may be between about 0.1 and 0.9 or, more specifically, between about 0.2 and 0.8 or even between about 0.3 and 0.7. These area ratios determine functionality of the resulting device.

Figure 1B:
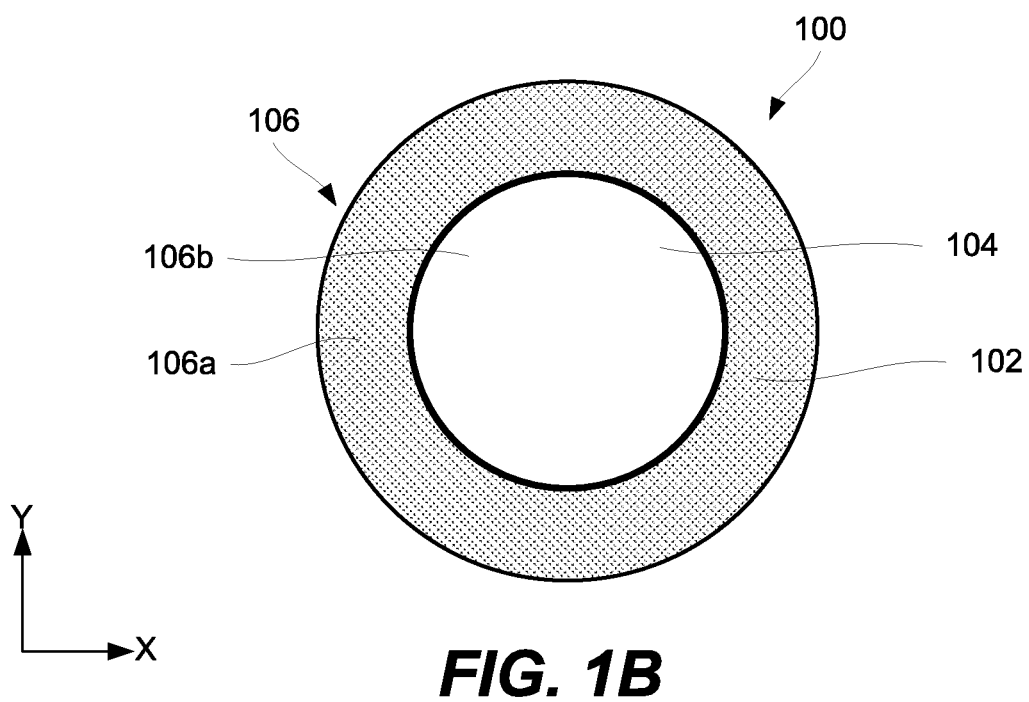
FIG. 1B is a schematic top view of the hybrid electrode also shown in FIG. 1A, in accordance with some embodiments.
Figure 1C:
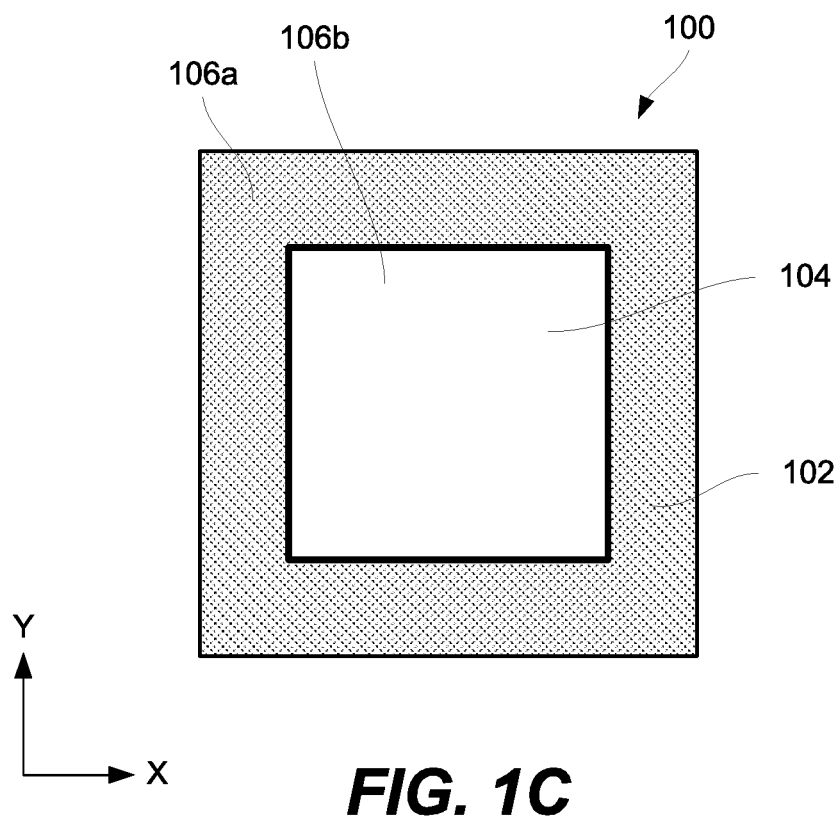
FIG. 1C is a schematic top view of another hybrid electrode having different configurations of the base structure and the plug, in accordance with some embodiments.
Figure 1D:
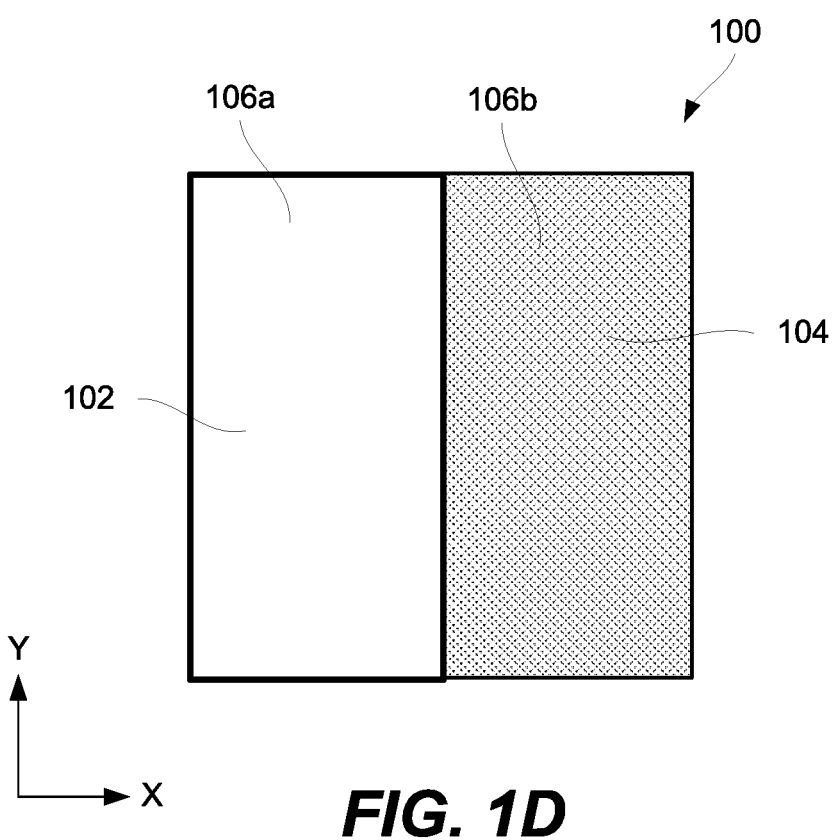
FIG. 1D is a schematic top view of a yet another hybrid electrode having different configurations of the base structure and the plug, in accordance with some embodiments.

In some embodiments, base structure 102 at least partially encloses plug 104 as, for example, shown in FIGS. 1A-1C. More specifically, base structure 102 may be concentric to plug 104 as shown in FIGS. 1B and 1C. The cross-sectional profiles within a plane (X-Y plane) perpendicular to the height (Z direction) of base structure 102 and plug 104 may be circular as shown in FIG. 1B, rectangular as shown in FIG. 1C, or have any other shape.

Both base structure 102 and plug 104 may be electrically conductive. However, their conductivities may be different. Differences in the conductivities and dimensions of base structure 102 and plug 104 may be used to achieve desired performance characteristics of the semiconductor device including hybrid electrode 100.

Figure 2A:
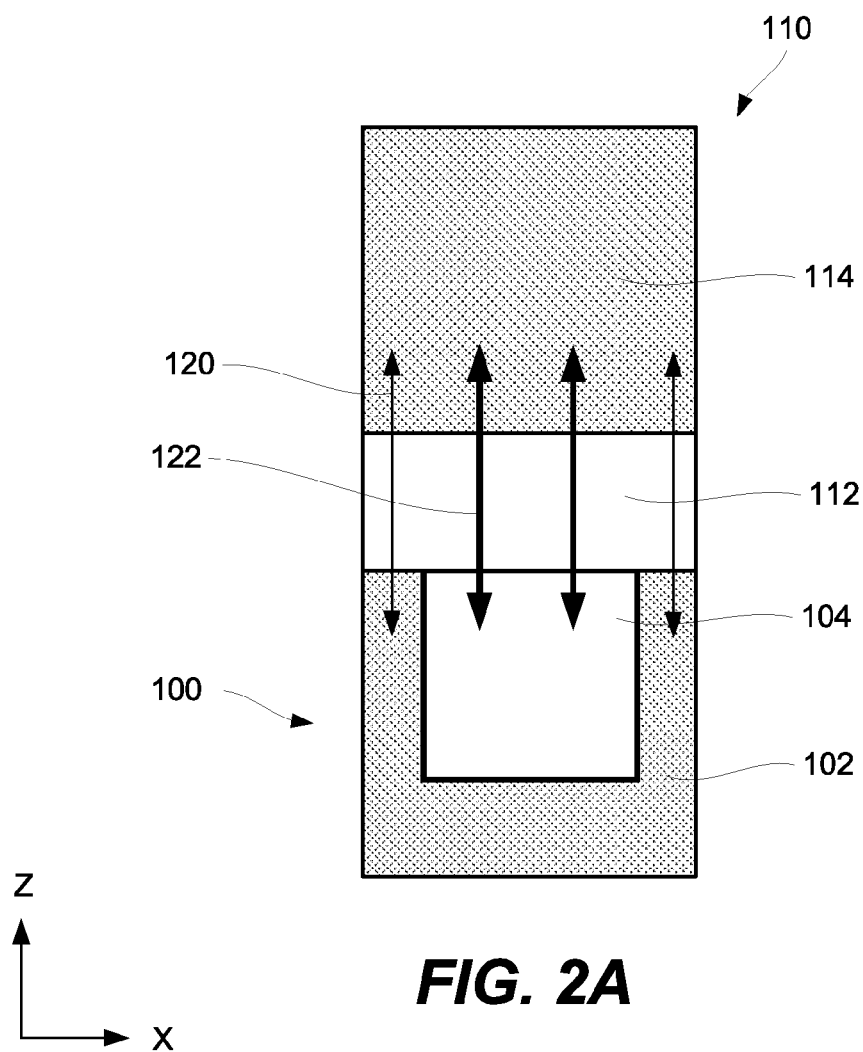
FIG. 2A is a schematic cross-sectional side view of a selector element comprising a hybrid electrode directly interfacing a dielectric layer, in accordance with some embodiments.

FIG. 2A is a schematic representation of semiconductor device 110 including hybrid electrode 100, in accordance with some embodiments. Semiconductor device 110 may be a selector element. In addition to hybrid electrode 100, semiconductor device 110 includes dielectric layer 112 and second electrode 114. In this example, hybrid electrode 100 may be referred to as a first electrode, while electrode 114 may be referred to as a second electrode. Dielectric layer 112 directly interfaces hybrid electrode 100 or, more specifically, each of base structure 102 and plug 104.

Figure 2C:
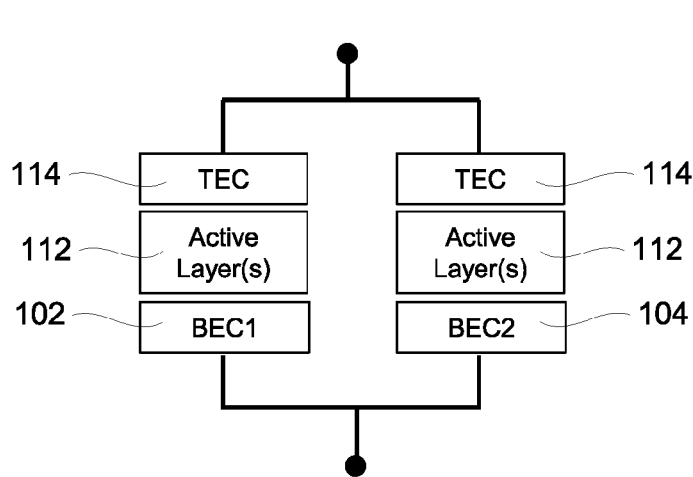
FIGS. 2B and 2C are equivalent electrical diagrams of the selector element shown in FIG. 2A, in accordance with some embodiments.
Figure 2B:
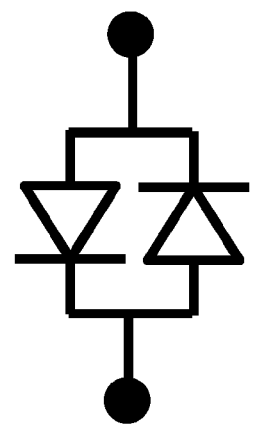

FIG. 2A also illustrates current paths 120 and 122 through semiconductor device 110. Current path 120 passes through base structure 102 and, therefore, is controlled by base structure 102. Current path 122 passes through plug 104 and, therefore, is controlled by plug 104. As such, semiconductor device 110 in FIG. 2A may be operable as a combination of two 2-terminal functional devices connected in parallel. FIG. 2C shows a schematic electrical configuration of such combination with numerical references identifying corresponding components of semiconductor device 110 in FIG. 2A. Selection of materials, arrangement, sizes, and other characteristics of dielectric layer 112, electrode 114, base structure 102 and plug 104 can yield various types of functions devices (parallel devices) having novel current-voltage responses. For example, two diodes in anti-parallel configuration for bipolar selector applications may be implemented by one semiconductor device 110 as, for example, schematically shown in FIG. 2B. In other words, a schematic electrical configuration shown in FIG. 2B representing two diodes in anti-parallel configuration may be achieved by single semiconductor device 110 with hybrid electrode 100.

In some embodiments, semiconductor device 110 illustrated in FIG. 2A may be used as a current selector. Current selectors, which may be also referred to as selectors or selector devices, may be used for various applications. For example, current selectors may be used in non-volatile memory structures for screening memory elements in these structures from sneak current paths and to ensure that only the selected bits are read or programmed to the memory elements. While Schottky diodes can be used as current selectors, which can include p-n junction diode or metal-semiconductor diode, these type of diodes are bulky structures and may use high thermal budget.

Figure 2D:
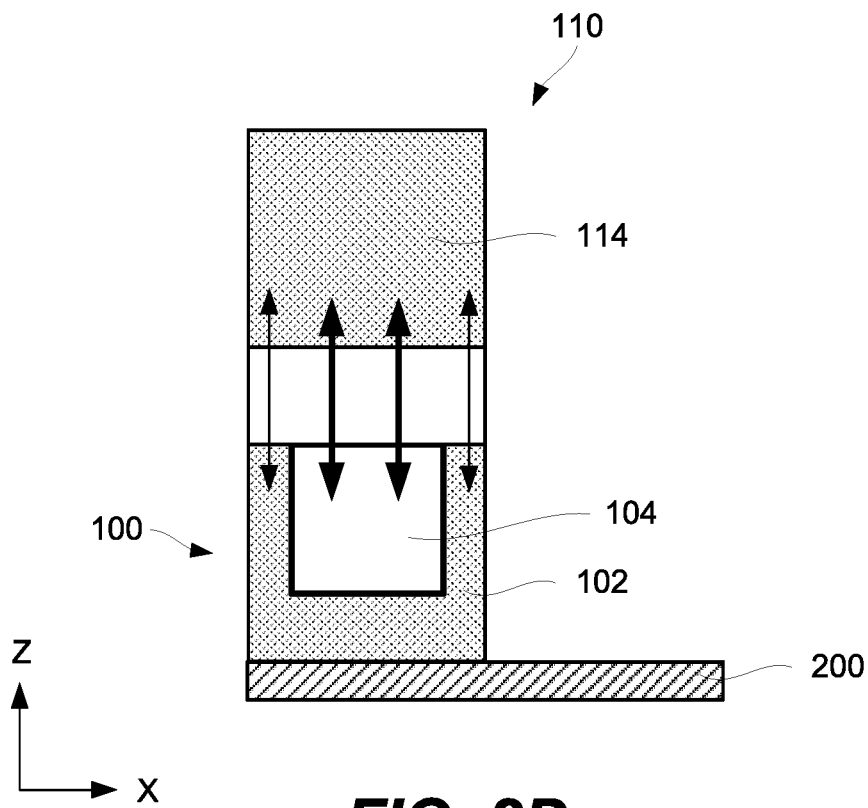
FIGS. 2D and 2E are schematic cross-sectional side views of the selector element having different connections to a current carrying lead, in accordance with some embodiments.
Figure 2E:
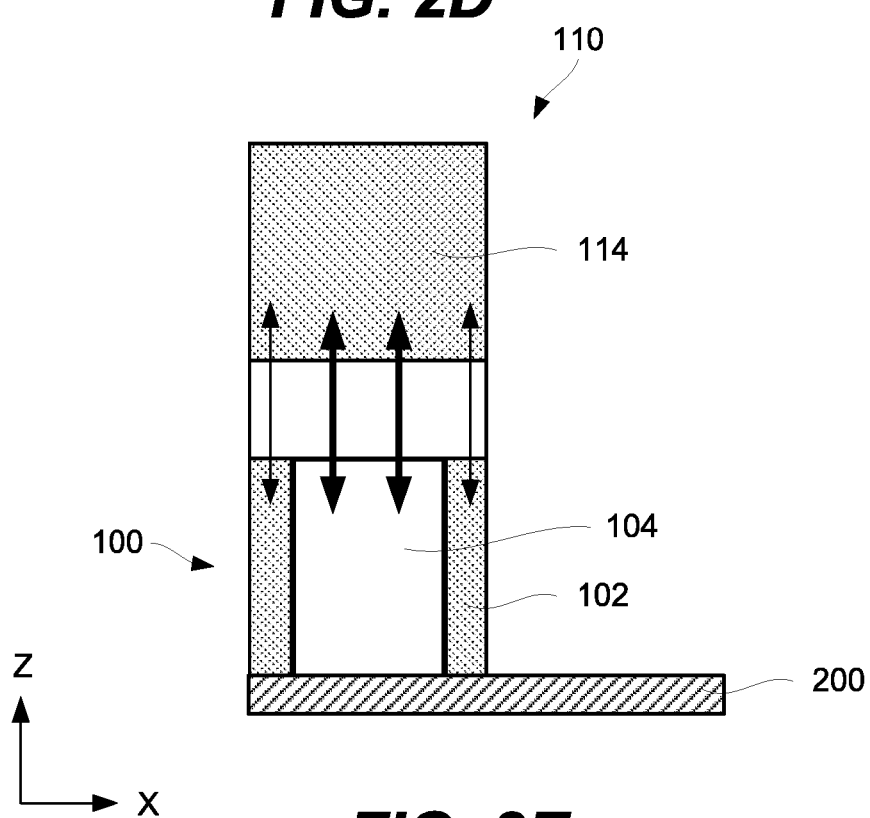

FIGS. 2D and 2E illustrate semiconductor device 110 in which hybrid electrode 100 is connected current carrying lead 200. In some embodiments, current carrying lead 200 is a word line or a bit line, for example, in a cross-bar array. Plug 104 of hybrid electrode 100 may be connected to current carrying lead 200 through base structure 102 as, for example, shown in FIG. 2D. Alternatively, plug 104 of hybrid electrode 100 may be connected directly to current carrying lead 200 as, for example, shown in FIG. 2E. In other words, plug 104 may directly interface current carrying lead 200. In this embodiments, the bulk of hybrid electrode 100 may be maintained at substantially the same potential.

Alternatively, base structure 102 may be electrically insulating from plug 104. For example, an insulating layer may be disposed between base structures 102 and plug 104. In this example, base structure 102 and plug 104 may be connected to different current carrying leads. Nevertheless, even in this example, shared surface 106 may interface the same component of semiconductor device 110 (e.g., its dielectric layer).

In some embodiments, dielectric layer 112 of semiconductor device 110 is formed from a chalcogenide such as $Cu_2GeSe_3$. Dielectric layer 112 is disposed between two electrodes, which may be the same type of different type of electrodes. For example, both electrodes may be hybrid electrodes. Alternatively, one electrode may be a hybrid electrode, while another electrode may be an electrode having uniform composition throughout the entire volume of the electrode.

Figure 3A:
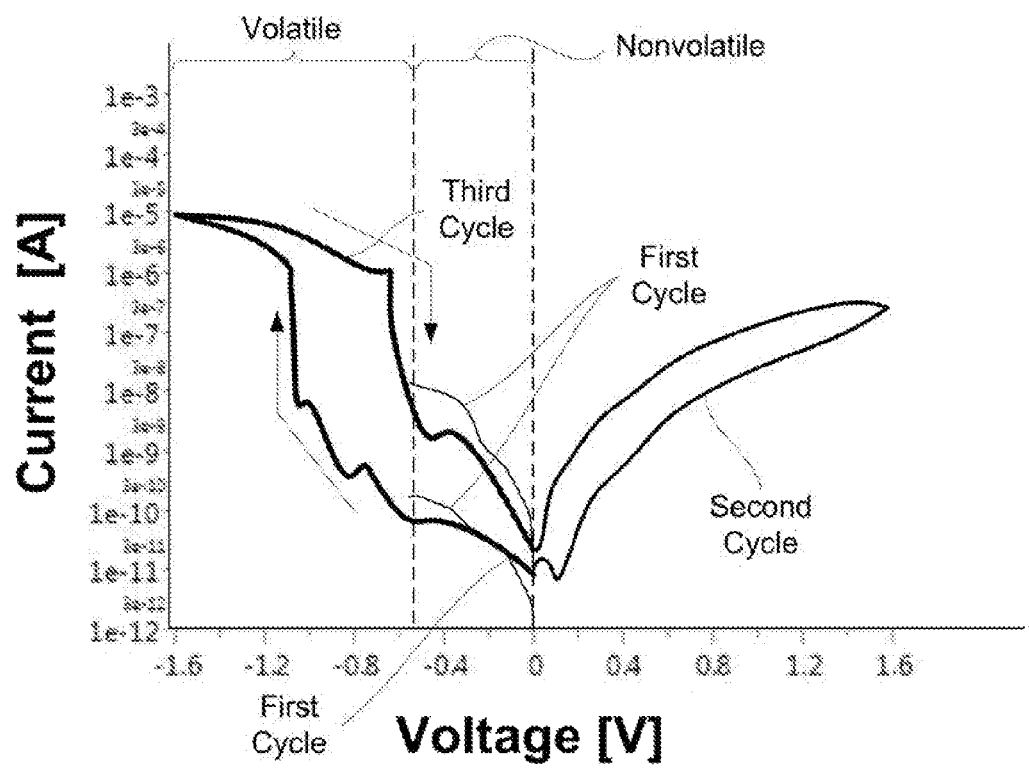
FIGS. 3A and 3B illustrate different cycles of I-V responses of a selector element formed using a hybrid electrode and $Cu_2GeSe_3$ dielectric layer.
Figure 3B:
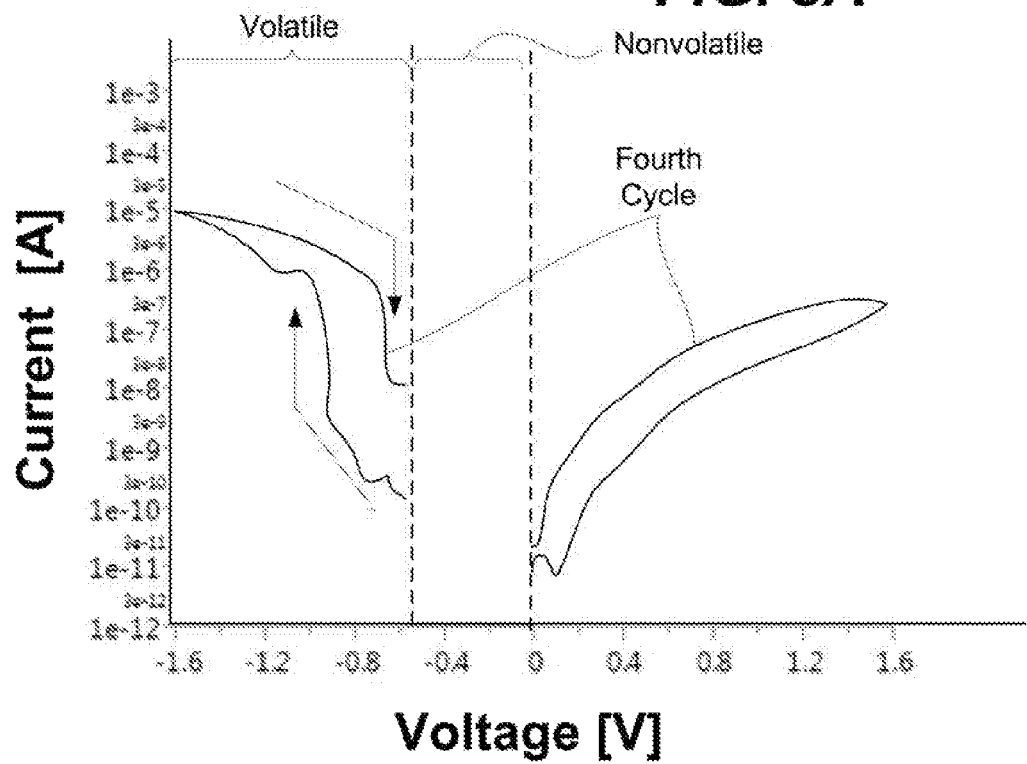
Figure 4:
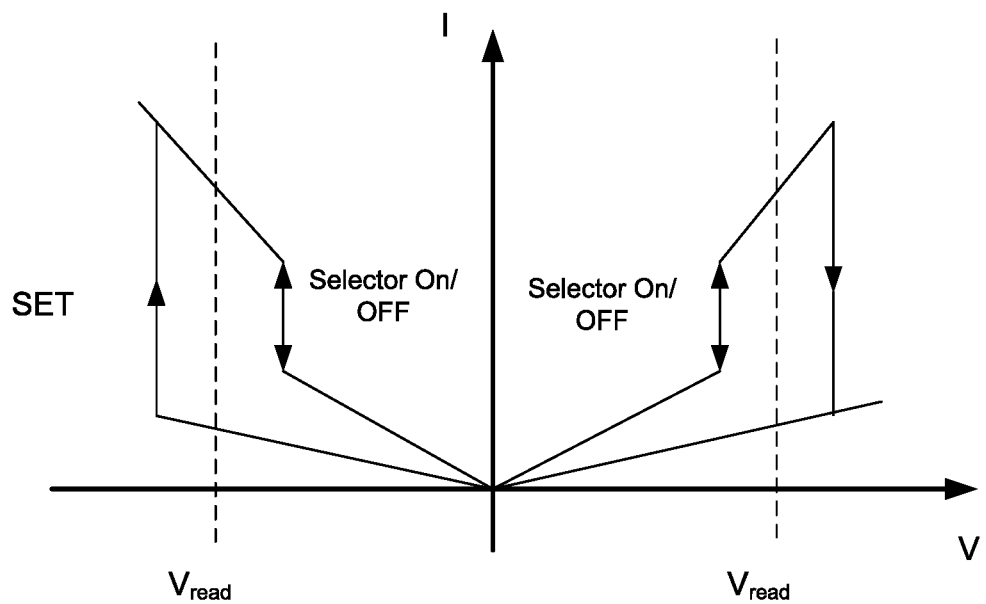
FIG. 4 is a schematic illustration of a hysteresis of FIGS. 3A and 3B.

Semiconductor device 110 (e.g., a current selector) formed as a single stack allows simple integration of this device into various types of circuits. For example, a current selector having a hybrid electrode may be used in memory arrays as 0T1R (no transistor and one resistor) type of devices. A test device has been assembled with $Cu_2GeSe_3$ as a dielectric layer and one hybrid electrode. The electrical performance of this device for the first four cycle is presented in FIGS. 3A-3B. The electrical performance data shows a selector-liker behavior consisting of volatile and non-volatile hysteresis. This hysteresis is schematically illustrated in in FIG. 4. This test device may be may be utilized for a selector-less cross-bar architecture.

Figure 5A:
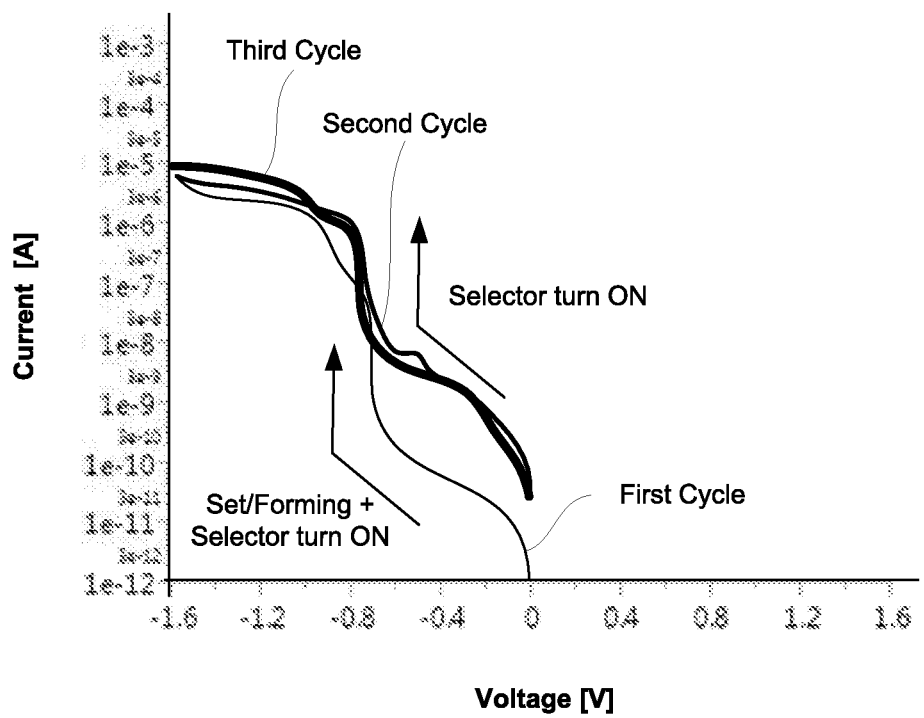
FIG. 5A is a I-V response plot of a unipolar sweep without a return of a selector element formed with a hybrid electrode.
Figure 5B:
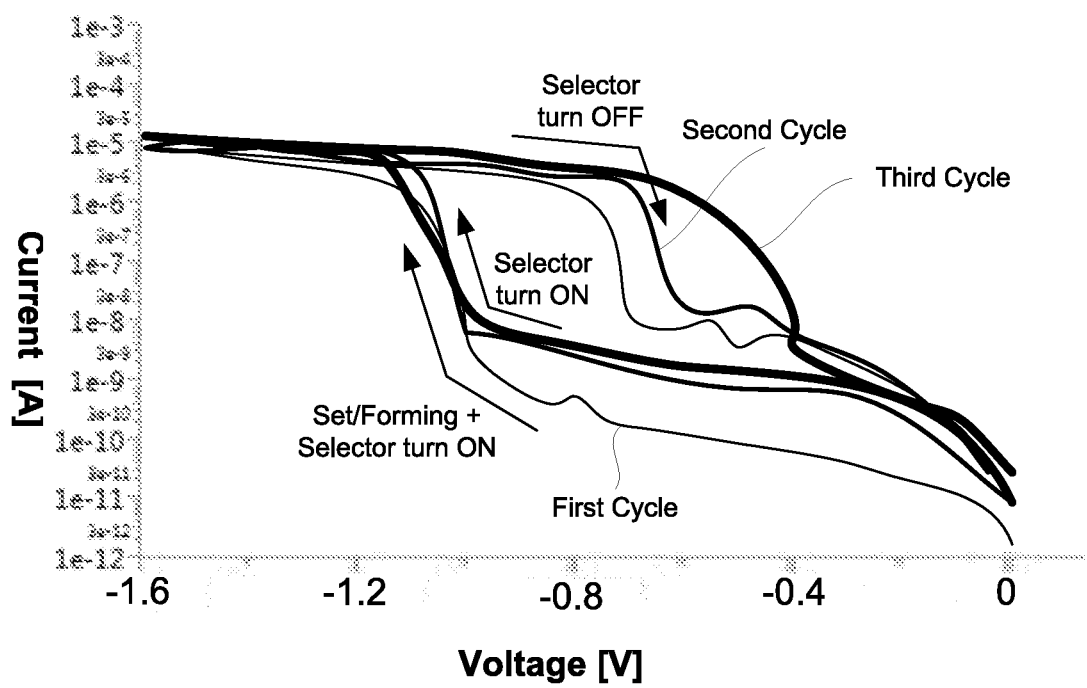
FIG. 5B is a I-V response plot of a unipolar sweep with a return of the same selector element.

Additional performance data showing a I-V response plot of a unipolar sweep without a return is shown in FIG. 5A, while a I-V response plot of a unipolar sweep with a return is shown in FIG. 5B. Both I-V response plots show substantial hysteresis that can be used for selector applications.

In some embodiments, current selectors, and methods to fabricate such selectors, for resistive-switching memory elements and cross point memory array are provided. The selector can be fabricated in accordance with configurations described above. The fabrication process of the selector may utilize low thermal budget, suitable for back end or 3D memory applications.

Figure 6:
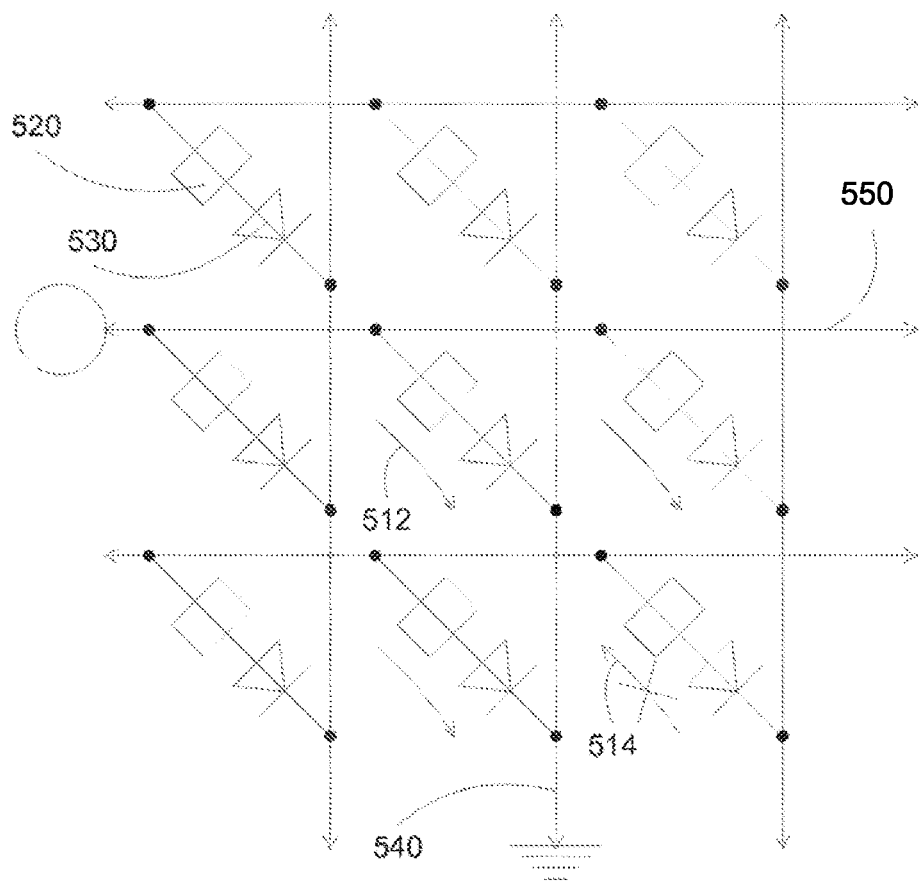
FIG. 6 illustrates a cross point memory array having selector elements connected in series with memory cells according to some embodiments.

To reduce or eliminate the sneak path occurrence a selector can be used in the cross point memory array. The selector can isolate the selected memory cell from unselected memory cells by breaking parallel connections of the memory cells. FIG. 6 illustrates a cross point memory array according to some embodiments. A memory device can include memory element 520 and selector 530, which are both disposed between electrodes 530 and 550. Selector 530 can be an intervening electrical component, disposed between electrode 530 and memory element 520, or between the electrode 540 and memory element 520. In some embodiments, selector 530 may include two or more layers of materials that are configured to allow or inhibit the current flow in different directions through memory element 520 when that memory element is not selected to read. In some embodiments, selector 530 can prevent a sneak path current when, for example, a sense current is generated.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A selector element comprising:
    a first electrode;
        wherein the first electrode is a hybrid electrode comprising a base structure and a plug disposed within the base structure,
            wherein the base structure comprises a first material and forms a first surface portion,
            wherein the plug comprises a second material and forms a second surface portion, and
            wherein the first material and the second material have different compositions,
    a dielectric layer directly interfacing the first surface portion and the second surface portion of the first electrode, wherein the dielectric layer comprises $Cu_2GeSe_3$; and
    a second electrode forming a stack with the first electrode and the dielectric layer such that the dielectric layer is disposed between the first electrode and the second electrode.

2. The selector element of claim 1, wherein at least one of the first material and the second material comprises a dopant.

3. The selector element of claim 1, wherein at least one of the first material and the second material comprises a material selected from the group consisting of titanium metal, aluminum metal, tungsten metal, nickel metal, titanium nitride, titanium silicon nitride, tantalum silicon nitride, molybdenum dioxide, and polysilicon.

4. The selector element of claim 1, wherein both the first material and the second material comprise a material selected from the group consisting of titanium metal, aluminum metal, tungsten metal, nickel metal, titanium nitride, titanium silicon nitride, tantalum silicon nitride, molybdenum dioxide, and polysilicon.

5. The selector element of claim 1, wherein the first surface portion and the second surface portion are disposed within a same plane.

6. The selector element of claim 1, wherein an area of the first surface portion is different from an area of the second surface portion.

7. The selector element of claim 1, wherein the base structure encloses the plug at least around the perimeter of the second surface portion.

8. The selector element of claim 1, wherein the base structure encloses all surfaces of the plug besides the second surface portion.

9. The selector element of claim 1, wherein the base structure and the plug are concentric.

10. The selector element of claim 1, wherein the plug is cylindrical.

11. The selector element of claim 1, wherein the selector element is operable to exhibit volatile and non-volatile hysteresis.

12. The selector element of claim 1, wherein the selector element is operable as an anti-parallel dual diode.

13. A memory array comprising:
 a memory cell; and
 a selector element connected in series with the memory cell, the selector element comprising:
  a first electrode being a hybrid electrode and comprising a base structure and a plug disposed within the base structure,
   wherein the base structure comprises a first material and forms a first surface portion,
   wherein the plug comprises a second material and forms a second surface portion, and
   wherein the first material and the second material have different compositions,
  a dielectric layer directly interfacing the first surface portion and the second surface portion of the first electrode;
  a second electrode forming a stack with the first electrode and the dielectric layer such that the dielectric layer is disposed between the first electrode and the second electrode; and
 a word line directly interfacing each of the base structure and the plug of the first electrode.

14. The memory array of claim 13, wherein the memory cell is one of dynamic random-access memory (DRAM), static random-access memory (SRAM), or resistive random-access memory (RRAM).

* * * * *